(12) United States Patent
Yamamoto

(10) Patent No.: US 6,621,436 B2
(45) Date of Patent: Sep. 16, 2003

(54) DELTA SIGMA TYPE AD CONVERTER HAVING BAND PASS FILTER TRANSMISSION FUNCTIONALITY

(75) Inventor: Yuji Yamamoto, Kawagoe (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 10/145,812

(22) Filed: May 16, 2002

(65) Prior Publication Data

US 2002/0175847 A1 Nov. 28, 2002

(30) Foreign Application Priority Data

May 23, 2001 (JP) ..................... P2001-154094

(51) Int. Cl.[7] ............................................... H03M 3/00
(52) U.S. Cl. ..................... 341/143; 341/144; 341/155
(58) Field of Search ................. 341/143, 155, 341/144

(56) References Cited

U.S. PATENT DOCUMENTS

| | | | |
|---|---|---|---|
| 5,629,701 A | 5/1997 | Ritoniemi et al. | 341/143 |
| 5,736,950 A | 4/1998 | Harris et al. | 341/143 |
| 5,760,722 A | 6/1998 | Harris et al. | 341/143 |
| 5,838,270 A | 11/1998 | Kiriaki | 341/143 |
| 5,917,440 A | 6/1999 | Khoury | 341/143 |
| 5,982,316 A * | 11/1999 | Shin | 341/143 |
| 6,023,184 A * | 2/2000 | Little | 327/336 |
| 6,232,900 B1 * | 5/2001 | Hendricks et al. | 341/143 |

* cited by examiner

Primary Examiner—Peguy JeanPierre
(74) Attorney, Agent, or Firm—Morgan, Lewis & Bockius LLP

(57) ABSTRACT

On a first stage of the delta sigma type AD converter for quantizing an input analog signal, converting it to an output digital signal, and outputting, the computing element adds a feedback signal from a second stage DA converter and subtracts a feedback signal in which the output of the delay unit is multiplied at a coefficient $\alpha$ with a coefficient buffer and a feedback signal from the delay unit, the input analog signal is output to a computing element on a post stage, and on the second stage, feedback by a coefficient $\beta$, different from a coefficient $\alpha$, is executed. The frequency characteristic of quantization noise $Q(Z)$ selects coefficients $\alpha$, $\beta$ so appropriately that transmission zero points are provided above and below the central frequency of an input analog signal, and the quantization noise can be damped in the range of a wide bandwidth.

11 Claims, 6 Drawing Sheets

$$H(Z) = -aX(Z)Z^{-4} + (1 + \alpha Z^{-1} + Z^{-2})(1 + \beta Z^{-1} + Z^{-2})Q(Z)$$

$$H(Z) = -aX(Z)Z^{-4} + (1 + \alpha Z^{-1} + Z^{-2})(1 + \beta Z^{-1} + Z^{-2})Q(Z)$$

$H(Z) = -aX(Z)Z^{-4} + (1+Z^{-2})^2 Q(Z)$

DELTA SIGMA TYPE AD CONVERTER HAVING BAND PASS FILTER TRANSMISSION FUNCTIONALITY

BACKGROUND OF THE INVENTION

1. Field of the Invention

The present invention relates to an AD converter, which quantizes input analog signals and converts them to digital signals and outputs them, more particularly, to technical field of the delta sigma type AD converter having band pass filter transmission function.

2. Description of the Related Art

In recent years, public attention has been paid to a digital tuner, which receives analog broadcasting wave and converts intermediate frequency (IF) signals obtained through a high frequency circuit to digital signals so as to digitize subsequent processing. The digital tuner utilizes a delta sigma type AD converter as a component for converting the IF signals to digital signals. Use of the delta sigma type AD converter enables quantization noise in the vicinity of the band of the IF signal frequency to be damped sufficiently, so as to achieve the quantization with a high resolution.

A general broadcasting receiver unit is often constructed so as to be capable of receiving both FM broadcasting and AM broadcasting, and it is preferable to employ the aforementioned delta sigma type AD converter for both FM broadcasting and AM broadcasting by using a common frequency of the IF signal. Further, the delta sigma type AD converter is capable of securing a sufficient damping amount of quantization noise by increasing the order number by multiple connections.

If both FM broadcasting and AM broadcasting are received through a broadcasting receiver unit, a desired frequency characteristic of the delta sigma type AD converter differs depending upon a difference in the modulation type. That is, the bandwidth of the IF signal in case of the FM broadcasting is narrower than the bandwidth of the AM broadcasting. For the reason, when receiving the AM broadcasting, the C/N ratio of the central frequency of the IF signal needs to be sufficiently high. Contrary to this, when receiving the FM broadcasting, although the required C/N ratio of the central frequency of the IF signal is not so strict as that of the AM broadcasting, the quantization noise needs to be damped in a larger bandwidth.

However, in case where a single delta sigma type AD converter is employed for both the FM broadcasting and AM broadcasting, a frequency characteristic preferable for the both cannot be achieved easily. Although there is an oversampling method for damping the quantization noise in a large bandwidth corresponding to reception of the FM broadcasting, for example, this method induces increase in cost and power consumption of the operational amplifier constructing a delay device and the like because such a structure requires high-speed operation of the circuit. Further, although there is a method for increasing the order number of the digital sigma type AD converter, such an increase of the order number may make feedback loop unstable or increase the circuit size. Further, increasing the order number of the delta sigma type AD converter for the AM broadcasting having a narrower bandwidth than the FM broadcasting produces a lot of waste from viewpoint of the structure.

SUMMARY OF THE INVENTION

Accordingly, the present invention has been achieved in views of the above-described problem and therefore, an object of the present invention is to provide a delta sigma type AD converter capable of achieving an excellent performance by providing with optimum frequency characteristic for both FM broadcasting and AM broadcasting without inducing increases in cost and circuit size by devising the setting of the transmission zero point thereof.

The above object of the present invention can be achieved by a delta sigma type AD converter for quantizing an input analog signal, converting it to an output digital signal, and outputting, provided with: a signal processing device which executes filter processing corresponding to a transmission function upon said input analog signal; and a quantizing device which quantizes the input analog signal subjected to said filter processing with a sampling frequency, converts it to the output digital signal, and outputs, wherein the frequency characteristic of quantization noise in said quantizing device has a first transmission zero point on the side of lower frequencies than the central frequency of said input analog signal and a second transmission zero point on the side of higher frequencies of said input analog signal.

According to the present invention, the input analog signal to the delta sigma type AD converter is subjected to filter processing corresponding to a predetermined transmission function. After that, it is quantized with a predetermined sampling frequency, converted to the output digital signal, and output. At this time, the quantization noise Q(Z) added by the quantizing device has the frequency characteristic possessing two transmission zero points above and below the input analog signal. Thus, by adjusting the frequency of these two transmission zero point, the range in which the quantization noise Q(Z) is damped by the frequency characteristic can be widened freely, so that the frequency characteristic preferable for condition such as bandwidth of the input analog signal can be achieved.

According to the present invention, the delta sigma type AD converter is provided with such a characteristic that the transmission zero points are provided above and below the central frequency of the input analog signal. Consequently, the quantization noise in the input analog signal having a wide bandwidth can be suppressed sufficiently without inducing increases of cost and circuit size. Particularly, it is possible to realize a digital sigma type AD converter, which is provided with an optimum frequency characteristic to both receptions of FM broadcasting and AM broadcasting so as to achieve an excellent performance.

The above object of the present invention can be achieved by a delta sigma type AD converter for quantizing an input analog signal, converting it to an output digital signal, and outputting, provided with: a first computing device which supplies a feedback signal to said input analog signal so as to execute a first filter computation; a second computing device which supplies a feedback signal to output signal of said second computing device so as to execute a second filter computation; and a quantizing device which quantizes the output signal of said second computing device with a sampling frequency, converts it to the output digital signal, and outputs, wherein the feedback signal of said first computing device contains a component expressed in $\alpha Z^{-1}$ with respect to a first coefficient $\alpha$ and the feedback signal of said second computing device contains a component expressed in $\beta Z^{-1}$ with respect to a second coefficient $\beta$, while said first coefficient $\alpha$ and said second coefficient $\beta$ are set to different values from each other.

According to the present invention, the input analog signal to the delta sigma type AD converter is subjected to the first filter computation by the first computing device and then, subjected to the second filter computation by the second computing device. After that, it is quantized with a predetermined sampling frequency and converted to the output digital signal. At this time, the first coefficient α is set up in the first computing device and the second coefficient β is set up in the second computing device. The respective feedback signals are constructed so as to contain components $\alpha Z^{-1}$ and $\beta Z^{-1}$. Then, like the first aspect of the present invention, the delta sigma type AD converter is provided with the frequency characteristic having two transmission zero points by setting the first coefficient α and the second coefficient β to different values from each other, so that the frequency characteristic preferable for condition about the bandwidth of the input analog signal can be realized.

In one aspect of the converter of the present invention, said first coefficient α and said second coefficient β have a relationship of α=−β.

According to the present invention, the first coefficient α is set up in the first computing device and the second coefficient β=−α is set up in the second computing device by the same structure as the second aspect of the present invention. Therefore, the feedback signals of the two computing devices contain components $\alpha Z^{-1}$, $-\alpha Z^{-1}$, which are symmetrical in terms of positive and negative, so that the frequency characteristic symmetrical with respect to the input analog signal can be achieved.

In another aspect of the converter of the present invention, the delta sigma type AD converter is further provided with a changing device which changes over connections of the feedback signal corresponding to said first coefficient α and the feedback signal corresponding to said second coefficient β to said first computing device and said second computing device.

According to the present invention, in addition to the structures described in the second aspect and the third aspect, the first coefficient α and the second coefficient β can be changed over. Thus, by changing over use of the first coefficient α and the coefficient β depending upon the bandwidth of the input analog signal, the frequency range in which the quantization noise is damped is adjusted, so that the performance corresponding to the frequency characteristic possessed by the input analog signal can be optimized.

In further aspect of the converter of the present invention, said input analog signal is an IF signal corresponding to FM broadcasting, while said first coefficient α and said second coefficient β are set so that the frequency characteristic of said quantization noise has a damping characteristic in a bandwidth based on frequency modulation.

According to the present invention, the quantization noise can be damped sufficiently in a wider frequency range by adjusting the first coefficient α and the second coefficient β corresponding to FM broadcasting of a large bandwidth. Consequently, the FM broadcasting reception performance can be improved without inducing increases of cost and circuit scale.

In further aspect of the converter of the present invention, said input analog signal is an IF signal corresponding to FM broadcasting or AM broadcasting, and said changing device controls itself so as to connect the feedback signal corresponding to said first coefficient α and said second coefficient β upon reception of FM broadcasting, while releasing the connection upon reception of AM broadcasting.

According to the present invention, in addition to the operation of the fourth aspect of the present invention, in case of FM broadcasting having a wide bandwidth, the IF signal is changed over so as to use the first coefficient α and the second coefficient β. In case of AM broadcasting having a narrow bandwidth, it is changed over so as not to use the first coefficient α and the second coefficient β, so that the quantization noise damping characteristic to both FM broadcasting and AM broadcasting can be adjusted optimally.

DESCRIPTION OF THE PREFERRED EMBODIMENTS

Hereinafter, the preferred embodiments of the present invention will be described with reference to the accompanying drawings. In this embodiment, a case where the present invention is applied to a delta sigma type AD converter for use in a digital tuner which receives FM broadcasting and AM broadcasting and which demodulates by digital signal processing will be described below.

Figure 1:
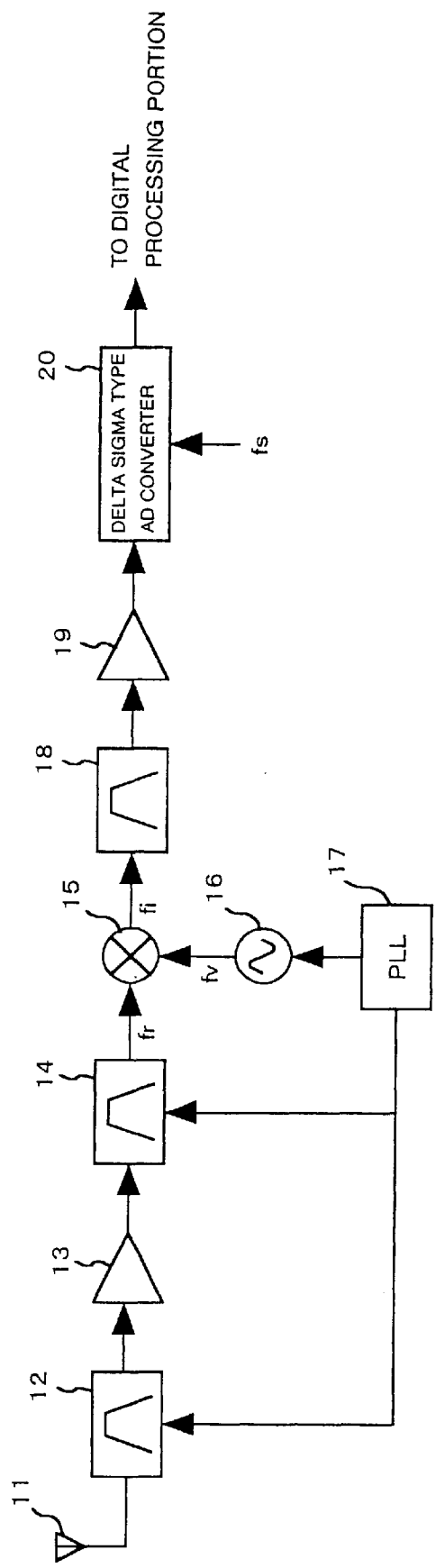
FIG. 1 is a block diagram showing the schematic structure of a digital tuner employing a delta sigma type AD converter according to the present invention.

FIG. 1 is a block diagram showing the schematic structure of the digital tuner employing the delta sigma type AD converter according to the present invention. FIG. 1 shows a circuit portion of the digital tuner for receiving broadcasting waves in which RF signal such as FM reception signal and AM reception signal is converted to the IF signal and it is AD-converted. FIG. 1 indicates an antenna 11, an antenna tuning circuit 12, an RF amplifier 13, an RF tuning circuit 14, a mixer portion 15, a VCO 16, a PLL 17, a band pass filter 18, an IF amplifier 19 and a delta sigma type AD converter 20.

With such a structure, a broadcasting electric wave from a broadcasting station is received by the antenna 11 and the reception signal is tuned to a predetermined frequency band by means of the antenna tuning circuit 12 and then output as the RF signal. A frequency band to be tuned by the antenna tuning circuit 12 changes depending on setting of the PLL 17. The RF signal output from the antenna tuning circuit 12 is amplified by the RF amplifier 13 and next, tuned in a narrower frequency band by the RF turning circuit 14, so that it is restricted to the vicinity of the frequency of a desired broadcasting station. The frequency band to be tuned by the RF tuning circuit 14 changes corresponding to the setting of the PLL 17. The RF signal whose band is restricted by the RF tuning circuit 14 is supplied to a mixer portion 15.

On the other hand, an oscillation signal from the voltage controlled oscillator (VCO) 16 is supplied to the mixer portion 15. This VCO 16 controls its oscillation frequency fv through the phase locked loop (PLL) 17. The PLL 17 controls itself so that the oscillation signal is synchronous with the reference signal in terms of the phase and an oscillation frequency fv corresponding to a desired broadcasting station is maintained. Then, the mixer 15 generates the IF signal by mixing the RF signal from the RF tuning circuit 14 with the oscillation signal of the VCO 16. Here, the frequency fi of the IF signal output from the mixer portion 15 is equivalent to a difference between the frequency fr of the RF signal and the oscillation frequency fv of the VCO 16. Because the frequency fi of the IF signal needs to be kept constant, it is necessary to control the oscillation frequency fv of the VCO 16 interlocked with the frequency of the desired broadcasting station by means of the PLL 17.

Next, the IF signal output from the mixer portion 15 is deprived of unnecessary frequency components by the band pass filter 18 and after that, amplified with a predetermined gain by the IF amplifier 19. Then, the IF signal output from the IF amplifier 19 is input to the delta sigma type AD converter 20 of the present invention and sampled with the sampling frequency fs. After that, it is converted to digital signals and output. Meanwhile, the detailed structure and operation of signal processing to be carried out in the delta sigma type AD converter 20 will be described later. Various kinds of digital processings are applied to the digital signal output from the delta sigma type AD converter 20 and finally output outside as a voice signal.

Next, the structure of the delta sigma type AD converter 20 of this embodiment will be described. In this embodiment, the characteristic and structure necessary for the delta sigma type AD converter differ depending upon which of the FM broadcasting or the AM broadcasting is to be received. Hereinafter, the delta sigma type AD converter 20 preferable for reception of the FM broadcasting and the delta sigma type AD converter 20 preferable for reception of both the FM broadcasting and AM broadcasting will be described.

Figure 2:
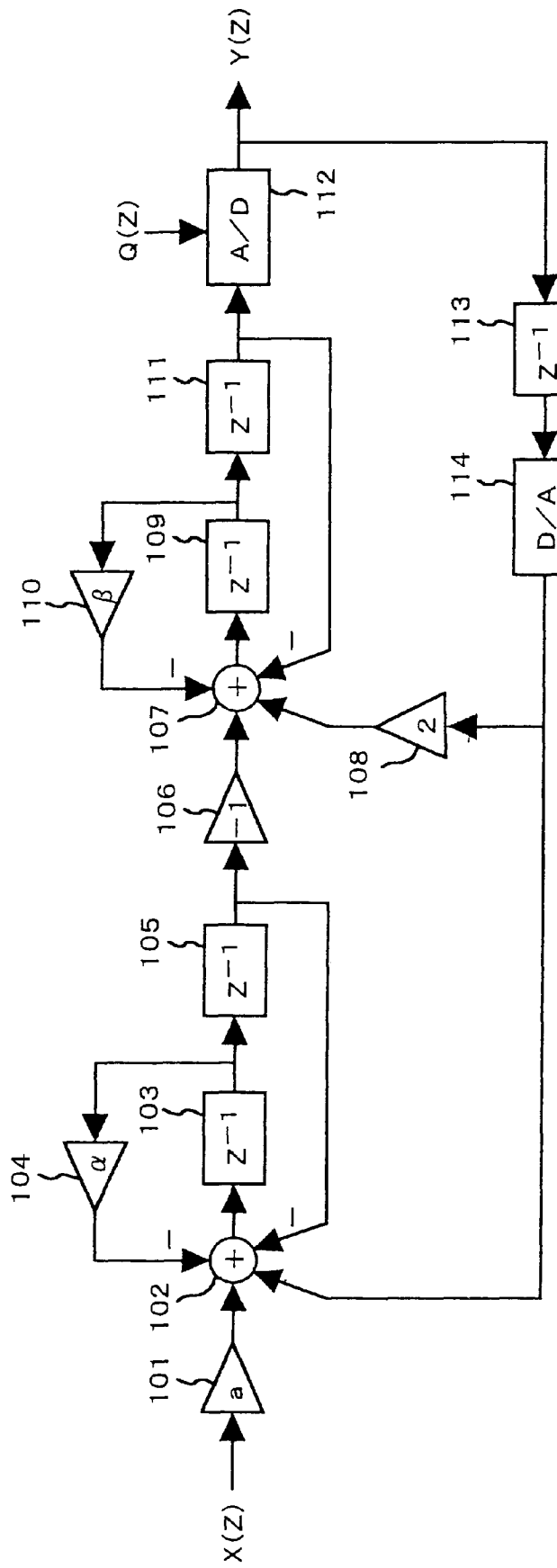
FIG. 2 is a block diagram showing the structure of a delta sigma type AD converter for use in reception of the FM broadcasting.

FIG. 2 is a block diagram showing the structure of the delta sigma type AD converter 20 for use in reception of the FM broadcasting. The delta sigma type AD converter 20 shown in FIG. 2 has band pass filter type structure, including a coefficient buffer 101, a computing element 102, a delay unit 103, a coefficient buffer 104, a delay unit 105, a coefficient buffer 106, a computing element 107, a coefficient buffer 108, a delay unit 109, a coefficient buffer 110, a delay unit 111, a quantizing device 112, a delay unit 113 and a DA converting portion 114. With such a structure, the input signal X(Z) is provided with the characteristic which is determined by a transmission function described later so as to generate digitized output signal Y(Z) and damp the quantization noise Q(Z) by a predetermined noise shaping characteristic.

Under such a structure, coefficient buffers 101, 104, 106, 108, 110 are devices which amplify the input signal with a preliminarily set coefficient and output. Delay units 103, 105, 109, 111, 113 are devices which delay the input signal by a clock and output. Computing elements 102, 107 are devices which execute addition and subtraction on plural input signals according to a predetermined combination and output. A quantizing element 112 is a device which quantizes the input signal with the sampling frequency fs and converts it to digital signal. A DA converting portion 114 is a device which converts the input digital signal to the analog signal and feeds back.

The feature of the structure shown in FIG. 2 is that output of the delay unit 103 is fed back to a computing element 102 by means of the coefficient buffer 104 located on a pre-stage in which a coefficient α is set up and output of the delay unit 109 is fed back to a computing element 107 by means of the coefficient buffer 110 in which a coefficient β is set up. Such a structure enables the delta sigma type AD converter 20 described later to possess an optimum frequency characteristic for the FM signal depending upon the coefficient α of the coefficient buffer 104 and the coefficient β of the coefficient buffer 110.

In the delta sigma type AD converter 20 having the structure shown in FIG. 2, the relationship between the input signal X(Z) and the output signal Y(Z) is expressed according to a following expression (1).

$$Y(Z) = -aX(Z)Z^{-4} + (1+\alpha Z^{-1}+Z^{-2})(1+\beta Z^{-1}+Z^{-2})^2 Q(Z) \quad (1)$$

(a is the coefficient of the coefficient buffer 101)

The expression (1) corresponds to a transmission function between the input signal X(Z) and the output signal Y(Z) and specifies the frequency characteristic of the quantization noise Q(Z) contained in the expression (1). According to this embodiment, the quantization noise Q(Z) needs to be as zero as possible in the frequency band of the IF signal which is expected to be the input signal X(Z). Further because the IF signal which is frequency-modulated possesses a specified bandwidth, the quantization noise Q(Z) needs to be reduced sufficiently within this range. Therefore, two transmission zero points are set up such that they are deviated symmetrically with respect to the IF signal by a coefficient $(1+\alpha Z^{-1}+Z^{-2})$ or a coefficient $(1+\beta Z^{-1}+Z^{-2})$.

Figure 3:
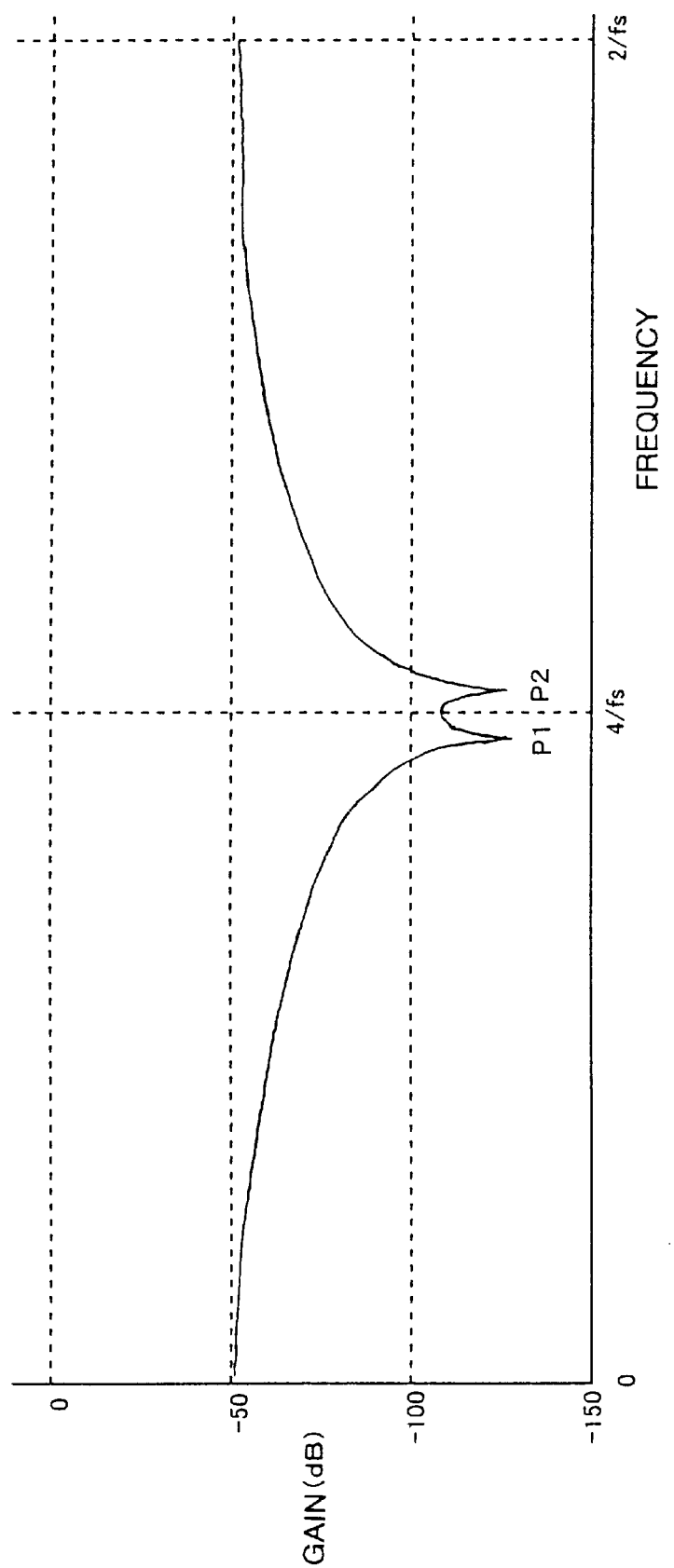
FIG. 3 is a diagram showing an example of the frequency characteristic corresponding to the delta sigma type AD converter having the structure shown in FIG. 2.

FIG. 3 is a diagram showing an example of the frequency characteristic corresponding to the delta sigma type AD converter 20 having the structure shown in FIG. 2. FIG. 3 shows an example in which corresponding to the frequency of 10.7 MHz of a standard IF signal, 42.8 MHz, which is fourfold thereof is set up as a sampling frequency fs. As shown in FIG. 3, this frequency characteristic indicates that the frequency is damped in the vicinity of 10.7 MHz which is the central frequency. A peak P1 exists on the side of low frequencies with respect to 10.7 MHz and a peak P2 exists on the side of higher frequencies. The reason is that in the delta sigma type AD converter 20 shown in FIG. 2, the transmission zero point on the pre-stage and the transmission zero point on the post stage are set with a slight deviation based on a difference between the coefficient α and the coefficient β.

Although these two peak positions in FIG. 3 can be changed by setting of the coefficients α, β, they need to be adjusted so as to ensure a frequency characteristic capable of obtaining a sufficient damping amount in a bandwidth based on frequency modulation. For example, because generally, the bandwidth of the frequency modulation is about 200 kHz, the coefficients α, β are only determined such that the frequency characteristic is damped within this range. Further, although the dampening amount of 10.7 MHz in the center is decreased because the positions of the peaks 1, 2 are deviated, the frequency of the IF signal for reception of the FM broadcasting is not required to have as high a C/N ratio as for reception of the AM broadcasting and if about 80 dB is secured, it is sufficient.

In the example shown in FIG. 3, the relationship between the frequency of the IF signal and the sampling frequency is 1:4, so that the two peaks P1, P2 appear symmetrically with respect to this. In this case, the relationship between the coefficient α and the coefficient β is set so that β=−α. On the other hand, the relationship between the frequency of the IF signal and the sampling frequency is not restricted to 1:4. In this case, if that relationship is set under α=γ+β, β=γ−δ, an offset corresponding to a coefficient γ is generated in the frequency characteristic and consequently, the relationship between the frequency of the IF signal and the sampling frequency can be adjusted to some extent.

Figure 4:
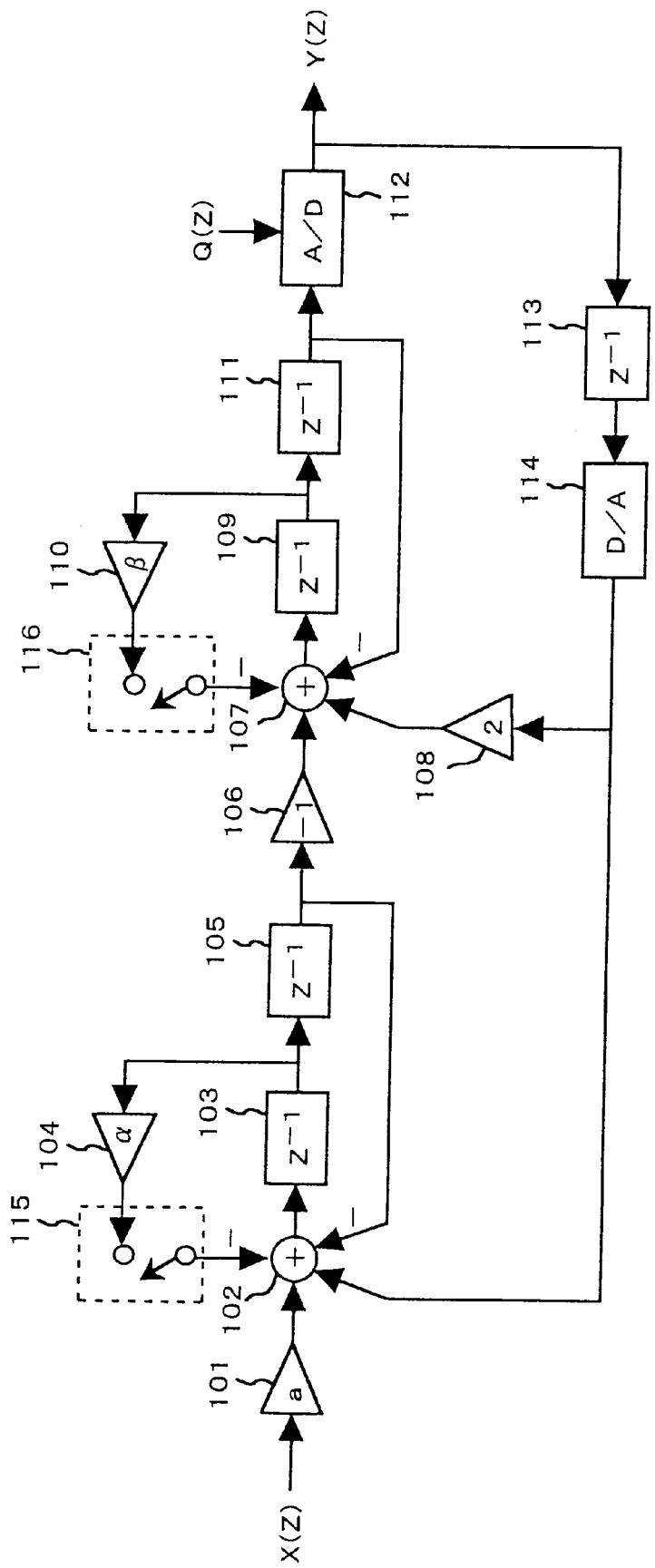
FIG. 4 is a block diagram showing the structure of the delta sigma type AD converter used for both FM broadcasting and AM broadcasting.

Next, a modification of the delta sigma type AD converter 20 of this embodiment will be described. FIG. 4 is a block diagram showing the structure of the delta sigma type AD converter 20 which can be used for both FM broadcasting and AM broadcasting. As shown in FIG. 4, the delta sigma type AD converter 20 of this case includes not only the components shown in FIG. 2 but also a switch portion 115 connected to the coefficient buffer 104 and a switch portion 116 connected to the coefficient buffer 110.

When the delta sigma type AD converter 20 receives the FM broadcasting, it is controlled so as to close the switch portions 115, 116. In this case, the delta sigma type AD converter 20 shown in FIG. 4 coincides with the structure shown in FIG. 2 and operates following the characteristic of the expression (1).

Figure 5:
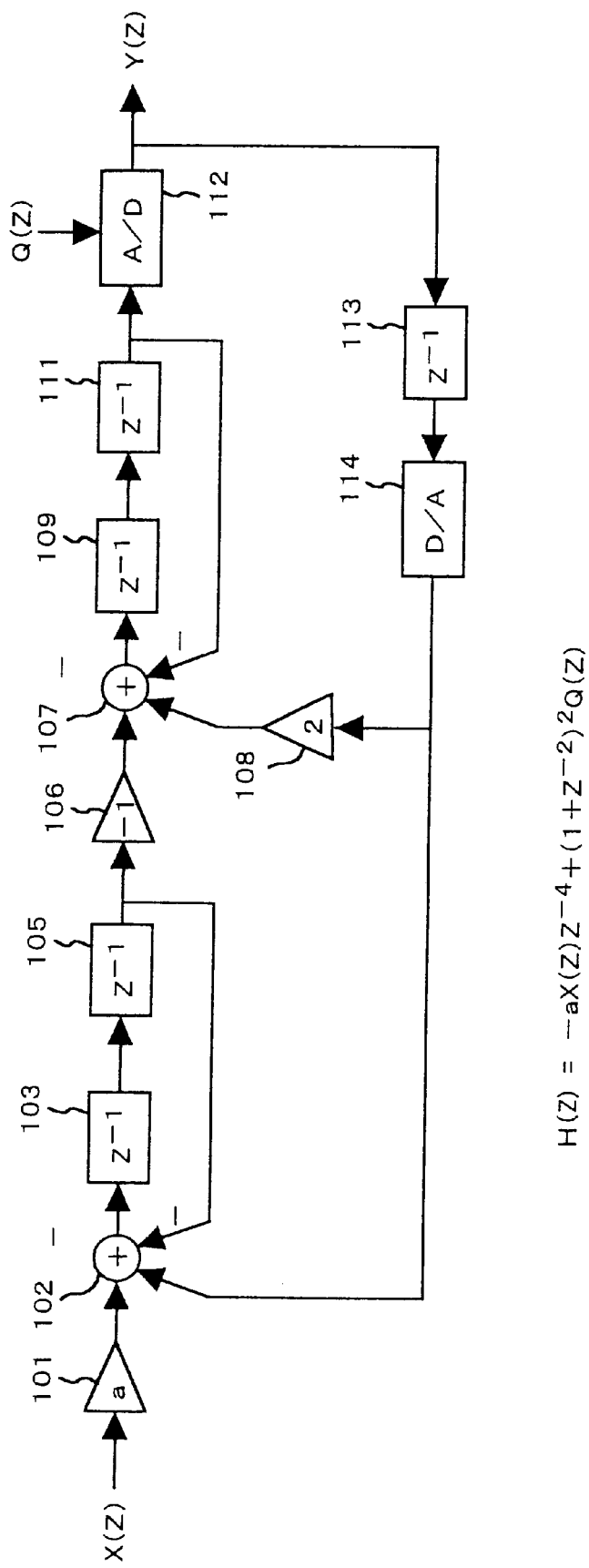
FIG. 5 is a block diagram showing an equivalent structure when two switching portions are opened in the structure of FIG. 4.

On the other hand, when the delta sigma type AD converter 20 receives AM broadcasting, it is controlled so as to open the switch portions 115, 116. In this case, connection between the two coefficient buffers 114 and 110 is released, so that the delta sigma type AD converter 20 becomes equivalent to the structure shown in FIG. 5. As for the structure of FIG. 5, the relationship between the input signal X(Z) and the output signal Y(Z) is expressed according to the expression (2).

$$Y(Z)=-aX(Z)Z^{-4}+(1+Z^{-2})^2 Q(Z) \quad (2)$$

If comparing this expression (2) with the expression (1), there is only a transmission zero point because the expression (2) does not contain the coefficients α, β. In this case, if the frequency of the IF signal is set to coincide with the transmission zero point, the quantization noise Q(Z) can be minimized.

Figure 6:
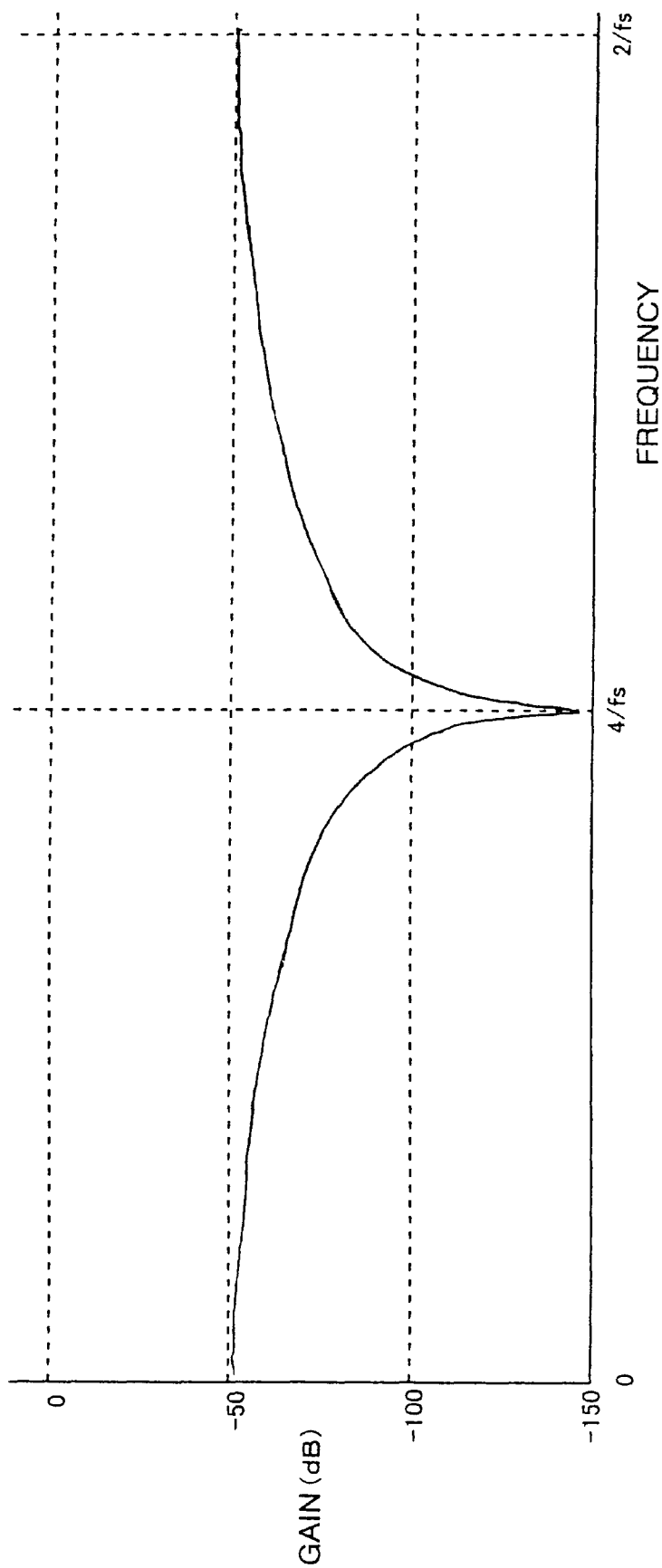
FIG. 6 is a diagram showing an example of the frequency characteristic corresponding to the digital sigma type converter when receiving AM broadcasting.

FIG. 6 is a diagram showing an example of the frequency characteristic corresponding to the delta sigma type AD converter 20 upon receiving the AM broadcasting. Like the case of FIG. 2, FIG. 6 shows a case where the frequency of the IF signal is 10.7 MHz while the sampling frequency fs is set to 42.8 MHz, which is fourfold. According to the characteristic shown in FIG. 6, while 10.7 MHz, which is the central frequency, induces a large damping amount, the range in which the frequency characteristic is damps gets narrow. Although the AM broadcasting requires a high C/N ratio in the central frequency, the frequency characteristic shown in FIG. 5 produces a shortage of the C/N ratio in the central frequency. On the other hand, because the bandwidth based on the amplitude modulation is narrower than the frequency modulation, it is desirable to use the frequency characteristic in which the peak is sharp as shown in FIG. 6 and the C/N ratio in the central frequency can be increased. Thus, it is effective to employ the structure shown in FIG. 5, in which the frequency characteristic is switched over depending upon for reception of FM or AM.

Although the structure of FIG. 2 or FIG. 4 indicates the delta sigma type AD converter 20 having two stages, it is permissible to connect the components shown in FIG. 2 or 4 so as to produce multiple-stage delta sigma type AD converter 20. In this case, the multiple-stage structure provides such a merit that the damping amount in the delta sigma type AD converter 20 can be secured, and because the structure becomes complicated thereby increasing the cost, the performance and cost are in trade-off relationship.

Although in the respective embodiments described above, a case where the delta sigma type AD converter of the present invention is applied to a digital tuner capable of receiving the FM broadcasting and AM broadcasting, the present invention is not restricted to this example. The present invention can be applied widely to various kinds of apparatuses having a structure for quantizing the input analog signal, converting it to the output digital signal, and outputting.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2001-154094 filed on May 23, 2001 including the specification, claims, drawings and summary is incorporated herein by reference in its entirety.

What is claimed is:

1. A delta sigma type AD converter for quantizing an input analog signal, converting it to an output digital signal, and outputting the output digital signal, comprising:

a signal processing device which executes filter processing corresponding to a transmission function upon said input analog signal; and a quantizing device which quantizes the input analog signal subjected to said filter processing with a sampling frequency, converts it to the output digital signal, and outputs the output digital signal, wherein frequency characteristic of quantization noise in said quantizing device has a first transmission zero point on the side of lower frequencies than a central frequency of said input analog signal and a second transmission zero point on the side of higher frequencies of said input analog signal.

2. A delta sigma type AD converter for quantizing an input analog signal, converting it to an output digital signal, and outputting the output digital signal, comprising:

a first computing device which supplies a feedback signal to said input analog signal so as to execute a first filter computation;

a second computing device which supplies a feedback signal to output signal of said first computing device so as to execute a second filter computation; and a quantizing device which quantizes the output signal of said second computing device with a sampling frequency, converts it to the output digital signal, and outputs the output digital signal, wherein the feedback signal of said first computing device contains a component expressed in $\alpha Z^{-1}$ with respect to a first coefficient α and the feedback signal of said second computing device contains a component expressed in $\beta Z^{-1}$ with respect to a second coefficient β, while said first coefficient α and said second coefficient β are set to different values from each other.

3. The delta sigma type AD converter as claimed in claim 2, wherein said first coefficient α and said second coefficient β have a relationship of α=−β.

4. The delta sigma type AD converter as claimed in claim 2, further comprising:

a changing device which changes over connections of the feedback signal corresponding to said first coefficient α and the feedback signal corresponding to said second coefficient β to said first computing device and said second computing device.

5. The delta sigma type AD converter as claimed in claim 4, wherein
said input analog signal is an IF signal corresponding to FM broadcasting or AM broadcasting, and
said changing device controls itself so as to connect the feedback signal corresponding to said first coefficient α and said second coefficient β upon reception of FM broadcasting, while releasing the connection upon reception of AM broadcasting.

6. The delta sigma type AD converter as claimed in claim 4, wherein
said first coefficient α and said second coefficient β have a relationship of α=−β,
said input analog signal is an IF signal corresponding to FM broadcasting or AM broadcasting, and
said changing device controls itself so as to connect the feedback signal corresponding to said first coefficient α and said second coefficient β upon reception of FM broadcasting, while releasing the connection upon reception of AM broadcasting.

7. The delta sigma type AD converter as claimed in claim 2, wherein
said first coefficient α and said second coefficient β have a relationship of α=−β, and
the delta sigma type AD converter further comprises a changing device which changes over connections of the feedback signal corresponding to said first coefficient α and the feedback signal corresponding to said second coefficient β to said first computing device and said second computing device.

8. The delta sigma type AD converter as claimed in claim 2, wherein
said input analog signal is an IF signal corresponding to FM broadcasting, while said first coefficient α and said second coefficient β are set so that the frequency characteristic of said quantization noise has a damping characteristic in a bandwidth based on frequency modulation.

9. The delta sigma type AD converter as claimed in claim 2, wherein
said first coefficient α and said second coefficient β have a relationship of α=−β, and
said input analog signal is an IF signal corresponding to FM broadcasting, while said first coefficient α and said second coefficient β are set so that the frequency characteristic of said quantization noise has a damping characteristic in a bandwidth based on frequency modulation.

10. The delta sigma type AD converter as claimed in claim 2, wherein
the delta sigma type AD converter further comprises a changing device which changes over connections of the feedback signal corresponding to said first coefficient α and the feedback signal corresponding to said second coefficient β to said first computing device and said second computing device, and
said input analog signal is an IF signal corresponding to FM broadcasting, while said first coefficient α and said second coefficient β are set so that the frequency characteristic of said quantization noise has a damping characteristic in a bandwidth based on frequency modulation.

11. The delta sigma type AD converter as claimed in claim 2, wherein
said first coefficient α and said second coefficient β have a relationship of α=−β,
the delta sigma type AD converter further comprises a changing device which changes over connections of the feedback signal corresponding to said first coefficient α and the feedback signal corresponding to said second coefficient β to said first computing device and said second computing device, and
said input analog signal is an IF signal corresponding to FM broadcasting, while said first coefficient α and said second coefficient β are set so that the frequency characteristic of said quantization noise has a damping characteristic in a bandwidth based on frequency modulation.

* * * * *